United States Patent [19]

Oka et al.

[11] Patent Number: 4,972,095
[45] Date of Patent: Nov. 20, 1990

[54] BINARY DIGITIZER CIRCUIT FOR VOLTAGES DEVELOPED ACROSS INDUCTION COIL

[75] Inventors: Hiroki Oka, Toyota; Nobuyoshi Nagura, Anjo; Keiichi Yamamoto, Okazaki, all of Japan

[73] Assignee: Aisin Seiki Kabushiki Kaisha, Aichi, Japan

[21] Appl. No.: 403,431

[22] Filed: Sep. 6, 1989

[30] Foreign Application Priority Data

Sep. 6, 1988 [JP] Japan .................. 63-222893

[51] Int. Cl.⁵ .................. H03K 9/06; H03K 5/04
[52] U.S. Cl. .................. 307/261; 307/519; 307/359; 307/551
[58] Field of Search .......... 307/261, 519, 551, 552, 307/559, 491, 360, 309, 359, 362; 328/5

[56] References Cited

U.S. PATENT DOCUMENTS

| | | | |
|---|---|---|---|
| 3,740,586 | 6/1973 | Banks et al. | 307/519 |
| 4,243,940 | 1/1987 | Ruof | 307/519 |
| 4,375,599 | 3/1983 | Bleckmann et al. | 307/519 |
| 4,823,060 | 4/1989 | Doemen | 307/519 |

Primary Examiner—Stanley D. Miller
Assistant Examiner—Hanh Nguyen
Attorney, Agent, or Firm—Sughrue, Mion, Zinn, Macpeak & Seas

[57] ABSTRACT

A pulse shaper is disclosed which shapes a vehicle speed signal developed by a tachometer and pulsating with a frequency which is proportional to a vehicle speed into a rectangular wave pulse. A reference potential line is biased above a common potential. The vehicle speed signal has its level clamped to a range from 0.6 V below to 0.6 V above the potential of the reference potential line. A first IC comparator digitizes the clamped speed signal into a binary form around the potential of the reference potential line. When the reference potential line becomes short-circuited to the common potential. The clamped vehicle speed signal which is applied to the inverting input of the first comparator reduces below the common potential, giving rise to the likelihood of an erroneous pulse. A second IC comparator then detects a reduction in the potential of the reference potential line to constrain the output of the first comparator to an L level, preventing an erroneous pulse from being delivered.

3 Claims, 5 Drawing Sheets

BINARY DIGITIZER CIRCUIT FOR VOLTAGES DEVELOPED ACROSS INDUCTION COIL

BACKGROUND OF THE INVENTION

The invention relates to an electrical circuit which shapes an electrical signal developed by an induction coil into a pulse form, and in particular, although not limited thereto, to a pulse shaper circuit which converts a voltage having a substantially sinusoidal waveform and a frequency which is substantially proportional to a vehicle speed, as produced by a tachometer, into pulses having a rectangular waveform.

By way of example, U.S. Pat. No. 4,314,340 issued to Nobuaki et al discloses a system for controlling the hydraulic pressure of a hydraulic control circuit associated with an automatic, variable speed transmission. The system includes a vehicle speed signal generator comprising an induction coil which cooperates with a permanent magnet coupled to an output shaft of the transmission to detect a rotation thereof, and an associated pulse shaper.

DESCRIPTION OF THE PRIOR ART

FIG. 2a schematically illustrates one well known system similar to the system for controlling an automatic, variable speed transmission disclosed in the above cited U.S. Patent. Specifically, an automatic, variable speed transmission 21 includes an output shaft 12, to which a permanent magnet 13 is coupled. The rotation of the magnet 13 is effective to induce a sinusoidal voltage across an induction coil 14. The resulting voltage is digitized in binary form into rectangular pulses by a pulse shaper 15 before it is fed to a microcomputer unit (MCU) 18. MCU 18 responds to a falling edge of the rectangular pulse from its high level H to its low level L by executing "an interrupt for detection of a vehicle speed" routine VSD shown in FIG. 2b, thus deriving a vehicle speed $V_1$ by calculation and writing it into a vehicle speed register $V_1$.

Referring to FIG. 2b, upon entering the VSD interrupt routine, MCU 18 reads a current time $T_1$ from a free running timer and writes it into a current time register $T_1$ (step S1), writes data stored in the vehicle speed register $V_1$ into a previous pass vehicle speed register $V_2$ (step S2), then calculates a time interval $T_1-T_2$ from the immediately preceding falling edge to the current falling edge of the rectangular pulse produced by the pulse shaper 15, and then calculates the vehicle speed $V_1$ on the basis of such time interval, which is then written into the vehicle speed register $V_1$ (subroutine S3). The data stored in the current time register $T_1$ is then written into the previous pass time register $T_2$ (step 4), whereupon the program returns to a main routine, not shown. As a result of the execution of the VSD interrupt routine, the vehicle speed register V now has the latest calculated vehicle speed data $V_1$ stored therein while the previous pass vehicle speed register $V_2$ has a vehicle speed data $V_2$, which was calculated one period of the rectangular pulse before the time when the data $V_1$ is calculated and the previous time register $T_2$ has its associated time $T_2$ stored therein.

Returning to FIG. 2a, a throttle opening sensor 10 and a shift lever position sensor 11 deliver signals indicative of the opening of a throttle valve on an onboard engine and the current position of an onboard shift lever to MCU 18. On the basis of the throttle opening signal, the lever position signal, the data stored in the vehicle speed register $V_1$, and a current gear ratio as well as data stored in an internal memory of MCU 18 which is utilized to determine an optimum gear ratio, MCU 18 determines a new gear ratio to be established. Specifically, it controls the energization and/or deenergization of shift solenoids 21a and 21b through solenoid drivers 19 and 20 so as to establish the new gear ratio in the transmission 21.

FIG. 3a shows a circuit diagram of a known arrangement which constitutes the electrical circuit of the pulse shaper 15 shown in FIG. 2a. Specifically, the induction coil 14, which produces a sinusoidal voltage of a frequency which is proportional to the rotational speed of the output shaft 12 of the transmission 21, has its one end connected to "a biased reference potential line" SP (−) which is positively biased with respect to a common potential or the electrical ground by a forward voltage drop (+0.6 +Vu V) across a diode D1 in a bias circuit 15b. The positively biased voltage (+0.6 +Vu V) appears on the reference potential line SP (−) by applying a positive constant voltage Vb to one end of a resistor R2, the other end of which is connected to the line SP (−). The magnitude of Vu depends on the current flow through the diode D1 and the resistor R2, and assumes a small positive value around 0.1 V.

The potential which is obtained at the other end of the induction coil 14 is applied to an inverting input (−) of a comparator IC1, formed by a semiconductor integrated circuit on a signal line SP (+) through a noise filter 15a, a clamper 15c and another noise filter 15d. A potential (+0.6 V) which is substantially equal to the potential of the line SP (−) is applied through a resistor R5 of a hysteresis circuit 15c is applied to a non-inverting input (+) of the comparator IC1.

The noise filter 15a serves bypassing noise voltages (of high frequencies) occurring across the lines SP (−) and SP (+), thus preventing them from being transmitted to the clamper 15c.

The clamper 15c is effective to limit the signal potential, or the potential on the line between registors R3 and R4 or the potential applied to the non-inverting input of the comparator, relative to the reference potential line SP (−) to a range which is nearly above −0.6 V and below +0.6 V, as determined by the forward voltage drops (0.6 V) across diodes D2 and D3. Since the line SP (−) assumes a potential of +0.6 +Vu V relative to the common potential or the electrical ground of the system, the signal potential relative to the common potential will vary in a range between +Vu V and 1.2 +Vu V. It is to be noted that the range of the signal potential which is applied to the inverting input (−) of the comparator IC1 lies higher than the common potential or the electrical ground.

High frequency noises are removed from the signal potential having its level limited in the described range in the clamper 15c, by means of the filter 15d.

The comparator IC1 comprises a semiconductor integrated circuit, as mentioned previously, and produces an output of a low level L when the potential, as referenced to the common potential, applied to the inverting input (−) is higher than the potential, as referenced to the common potential, applied to the inverting input (+), and produces an output of a high level H (open collector or open output end) otherwise.

The hysteresis circuit 15e is effective to raise the potential applied to the non-inverting input (+) of the comparator slightly above the reference potential (+0.6

+Vu V) when an output from the comparator assumes its L level, and to lower the potential applied to the non-inverting input (+) to be slightly below the reference potential when an output from the comparator assumes its H level. In this manner, the hysteresis circuit 15e is effective to impart a hysteresis to a threshold level used for the binary digitization or the potential applied to the non-inverting input (+) of the comparator IC1. The hysteresis functions to suppress a variation of an output from the comparator IC1 from its L to its H level or vice versa when the signal potential fluctuates around the reference potential (+0.6 +Vu V) through a reduced excursion.

The signal line disposed between the induction coil 14 and the pulse shaper 15 is shielded in order to prevent the occurrence of noises, with the shield cladding connected to the common potential or the electrical ground by means of a ground line SPG.

FIG. 3b graphically shows various electrical signals appearing in the electrical circuit shown in FIG. 3a. In the pulse shaper 15 shown in FIG. 3a, if the reference potential line SP (−) becomes short-circuited to the common potential or the electrical ground, the reference potential obviously reduces to the common potential, with consequence that the signal potential applied to the inverting input (−) of the comparator IC1 or the output potential from the clamper 15c will vary in a range which is above −0.6 V and below +0.6 V relative to the common potential. In other words, the potential applied to the inverting input (−) of the comparator IC1 will shift to the negative side of the common potential.

It will be appreciated that a comparing function by the comparator IC1, formed by a semiconductor integrated circuit, premises that a potential applied to its inverting input (−) be above a common potential or an electrical ground. There is no compensation for a mode of operation in which the potential applied to the inverting input (−) is below the common potential. If the potential applied to the inverting input (−) reduces substantially below the common potential, the comparator may provide an output of L level when it should deliver an output of H level. Accordingly, if the reference potential line SP (−) becomes short-circuited to the common potential, it will be noted that as shown in FIG. 3b, while the comparator delivers an output of H level as intended during the initial phase of an interval during which the comparator IC1 should deliver an output of L level, but the comparator IC1 changes its output to its L level at the signal level exhibits a large excursion to the negative side of the common potential, and subsequently changes its output to its H level again as the signal level returns near the common potential. It will thus be seen that there appear a pair of pulses (H) in the presence of a short-circuit during a time interval which corresponds to one period defined in the absence of such short-circuit. If such phenomenon occurs, MCU 18 shown in FIG. 2a will derive a value which is twice the actual vehicle speed to be written into the vehicle speed register $V_1$ during the VSD interrupt routine (FIG. 2b), whereby the control over the gear ratio of the transmission will be erroneous as a result of taking such value as a reference.

It is understood that any failure or fault which causes a disruption in the electrical pulse produced by the pulse shaper 15 as a result of the breakage in the induction coil 14 or its connected lead wire or a short-circuit across lead wires can be detected by MCU 18 or a separate abnormality detector circuit in a relatively simple manner. However, the electrical pulses are generated by the comparator IC1 in generally regular manner if they are produced at twice the normal frequency as when the reference potential line SP (−) becomes short-circuited to the ground line, and hence such failure is difficult to detect.

SUMMARY OF THE INVENTION

It is an object of the invention to provide a pulse shaper which facilitates the detection of any abnormality in the pulses produced by the pulse shaper in the event the reference potential line SP (−) becomes short-circuited to the common potential.

In accordance with the invention, the pulse shaper is associated with detecting means which produces information indicative of an abnormality in the event the potential of the reference potential line SP (−) relative to the common potential has reduced below a given value.

In a preferred embodiment of the invention, a diode D4 is interposed between the diode D1 of the bias circuit 15b and the common potential and poled in the same direction as the diode D1, and a cathode potential of the diode D1 is applied to an inverting input (−) of an additional comparator IC2, also formed by a semiconductor integrated circuit, while the anode potential of the diode D1 or the potential of the reference potential line SP (−) is applied to a non-inverting input (+) of the comparator IC2. In the event the reference potential line SP (−) becomes short-circuited to the common potential, the comparator IC2 changes its output from its H level (indicating a normal state) to its L level (indicating an abnormality).

The comparator IC2 is of an open collector type, and its output terminal remains open when it delivers an H level output while its output terminal is connected to the common potential when delivering an L level output. The output of the comparator IC2 is connected to the output of the comparator IC1, the latter being also of an open collector type. When the reference potential line SP (−) is not short-circuited to the common potential, the comparator IC2 is prevented from disturbing the pulse output from the comparator IC1 since the output end of the comparator IC2 remains open. However, when the line SP (−) is short-circuited to the common potential and the output from the comparator IC2 changes from its H to its L level, the output from the comparator IC1 is constrained to the common potential (L) and is prevented from pulsating since the output end of the comparator IC2 is connected to the common potential.

BRIEF DESCRIPTION OF THE DRAWINGS

FIG. 1b is a flow chart illustrating an abnormality detecting operation by MCU 18 shown in FIG. 1a;

FIG. 3b is a series of timing charts illustrating various electrical signals appearing in the electrical circuit shown in FIG. 3a.

DESCRIPTION OF PREFERRED EMBODIMENT

Figure 1A:
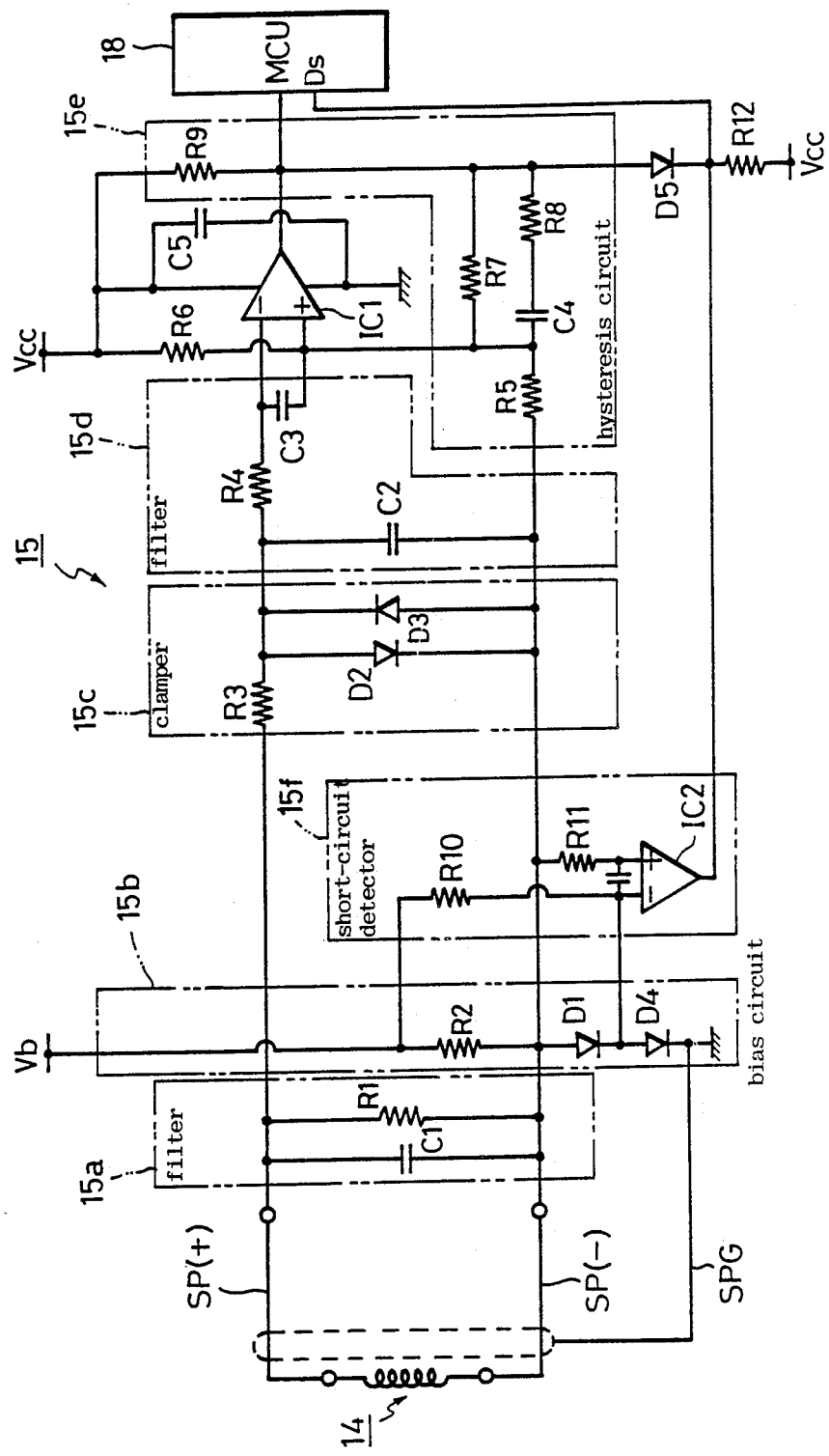
FIG. 1a is a circuit diagram of a pulse shaper according to one embodiment of the invention.
Figure 3A:
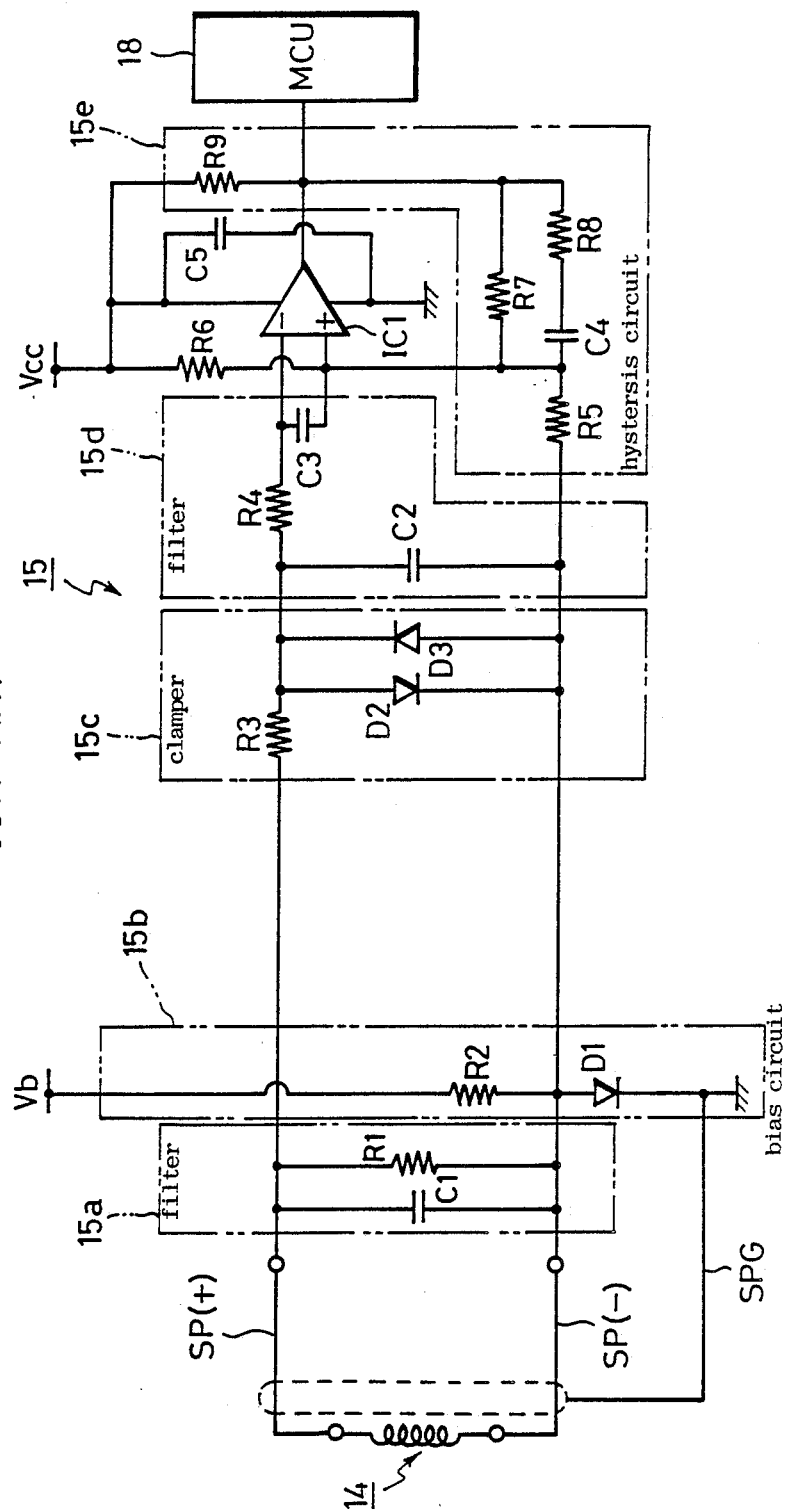
FIG. 3a is a circuit diagram of one conventional form of a pulse shaper 15.

Referring to FIG. 1a, there is shown a pulse shaper which is also designated by reference numeral 15, but which represents an improvement over the conventional pulse shaper 15 shown in FIG. 3a. Considering the improvement, the bias circuit 15b includes one diode D4, which is added so as to be connected between the diode D1 and the common potential and is poled in the same polarity as the diode D1. An electric current which is substantially equal to Vb/R2 passes through resistor R2 and the diodes D1 and D4. A current which is substantialy equal to Vb/R11 also passes through the diode D4 via resistor R10 of a short-circuit detector 15f. Accordingly, the current which passes through the diode D1 will be substantially equal to Vb/R2, and the forward voltage drop thereacross will be +0.6 +Vu V. By contrast, the current which passes through the diode D4 will be approximately equal to Vb/R2 +Vb/R11, and the forward voltage drop thereacross will be +0.6 +Vu +Vau V. Accordingly, the line SP (−) will assume a potential which is +1.2 +2 Vu +Vau V above the common potential. The short-circuit detector 15f includes a comparator IC2, formed by a semiconductor integrated circuit, which receives a reference potential (+1.2+2 Vu+Vau V) at its non-inverting input (+) and receives the anode potential (+0.6+Vu+Vau V) of the diode D4 at its inverting input (−), so that the comparator IC2 delivers an output of H level. The comparator IC2 is of an open collector type, and its output end remains open when the comparator is delivering an H level output. In the event the line SP (−) becomes short-circuited to the common potential, the both inputs to the non-inverting and the inverting input (+) and (−) of the comparator IC2 will drop to the common potential, whereby the comparator IC2 changes its output from its H to its L level, thus causing its output connected to the common potential. An output of L level from the comparator IC2 represents the short-circuiting of the reference potential line SP (−) to the common potential.

Figure 3B:
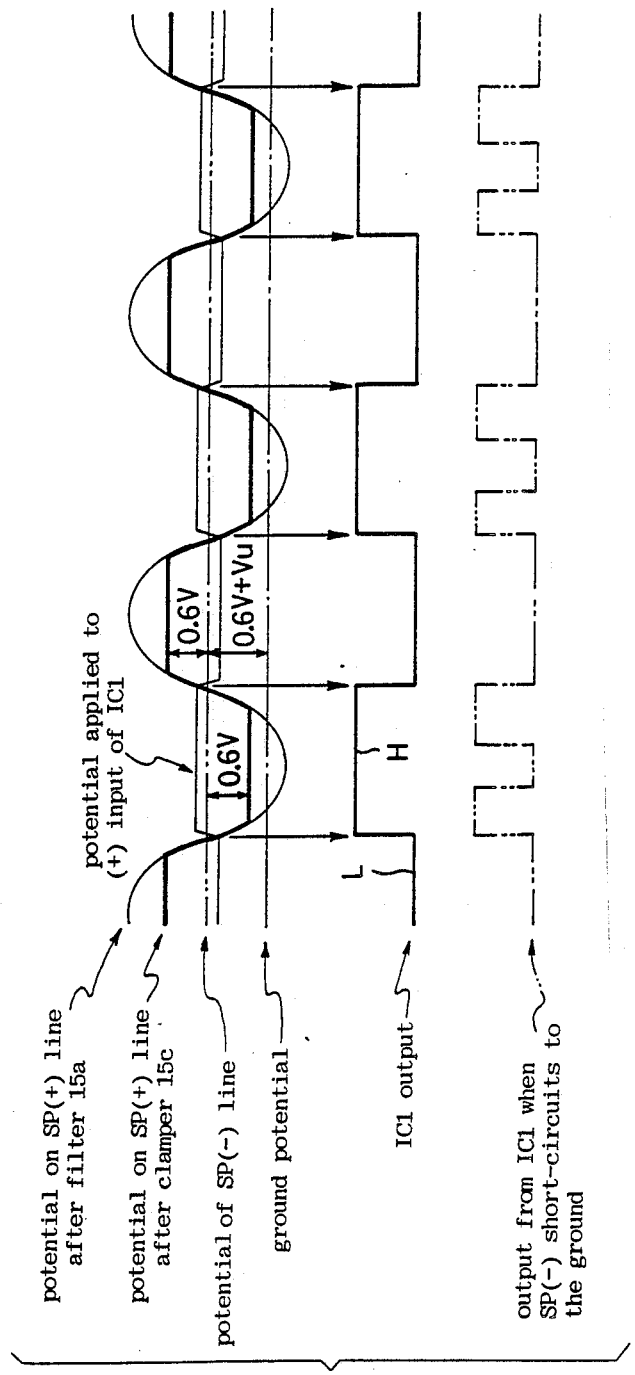

The output of the comparator IC1 is connected through a diode D5 to the output of the comparator .IC2, so that when the output from the comparator IC2 is at its H level (no short-circuit), the comparator IC1 delivers a pulse of rectangular waveform as indicated in solid line in FIG. 3b to MCU 18. However, when the short-circuit occurs, the output of the comparator IC2 assumes its L level or its output will be connected to the common potential, whereby the output potential of the comparator IC1 will be constrained to the L level or the common potential, thus causing the comparator IC1 to deliver a signal to MCU 18 which remains at its L level, thus failing to provide a rectangular pulse to MCU 18. The output from the comparator IC2 is also fed to an input Ds of MCU 18.

Figure 1B:
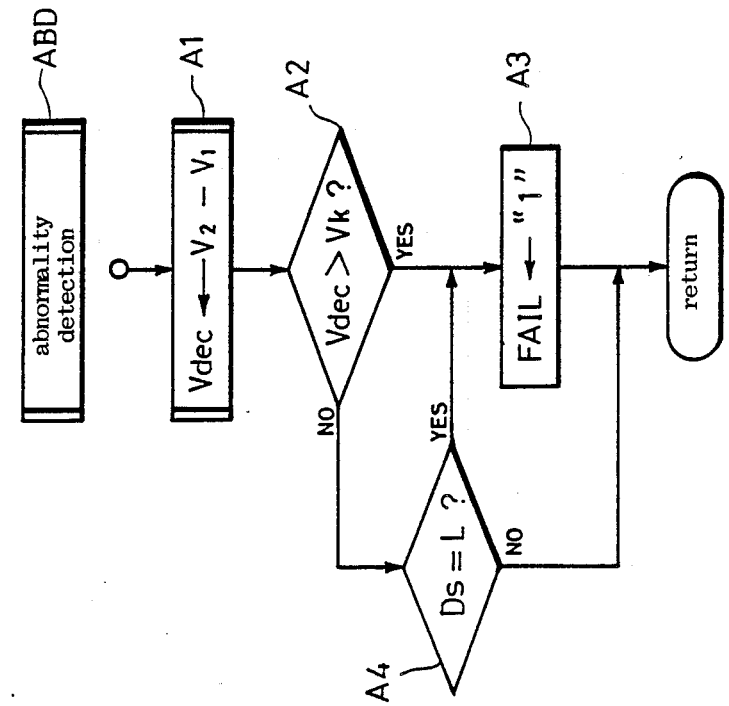
Figure 2A:
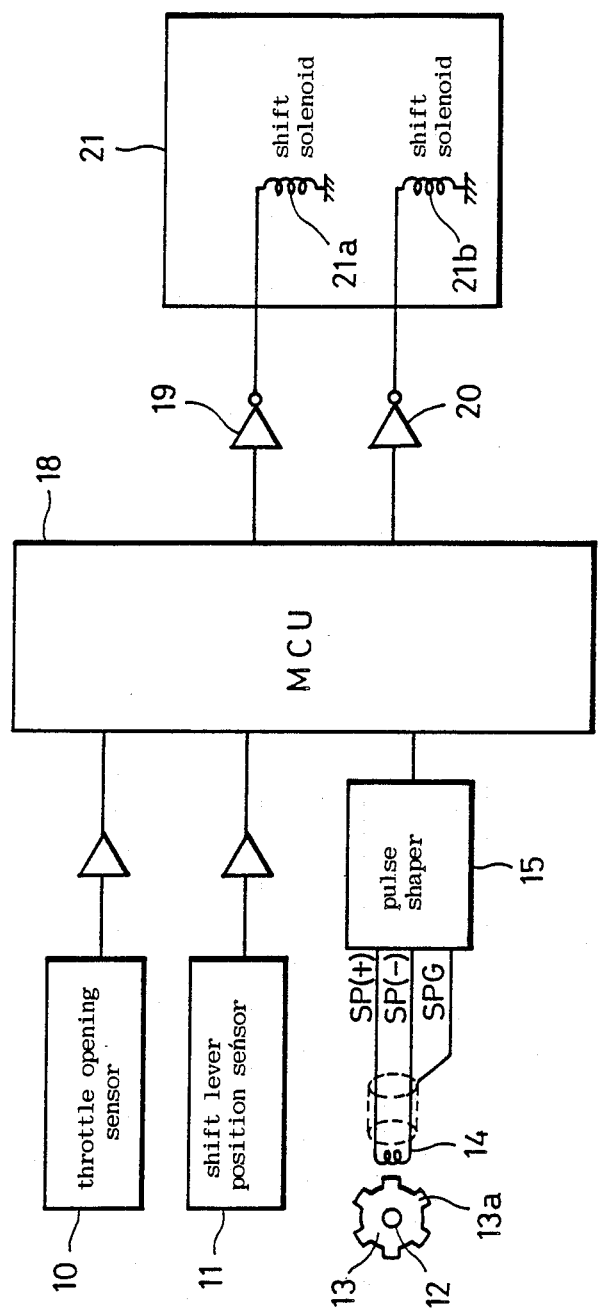
FIG. 2a is a block diagram schematically illustrating a well known system for controlling an automatic, variable speed transmission.

MCU 18 shown in FIG. 1b executes an abnormality detecting routine ABD shown in FIG. 1b at a substantially given interval. In the ABD routine, data stored in the previous speed register $V_2$ and the speed register $V_1$ are used to calculate a speed reduction Vdc = $V_2$-$V_1$ (step A1), and an examination is made to see if the speed reduction Vdc exceeds a preset value Vk (step A2). If the speed reduction exceeds the preset value Vk, "1" is entered in an error register FAIL (step A3), and the program then returns to a main routine (not shown).

Figure 2B:
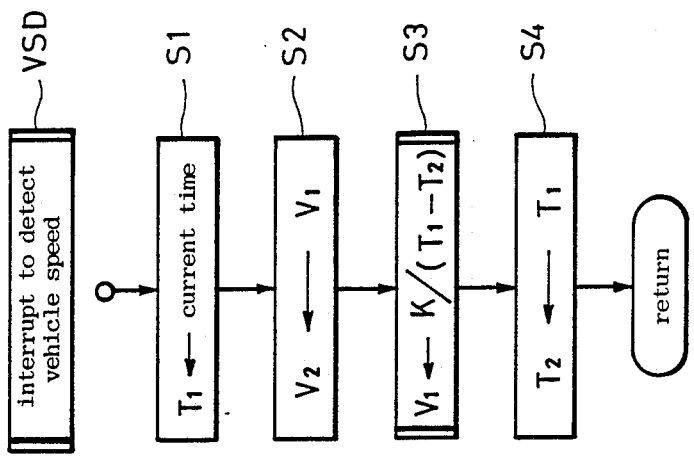
FIG. 2b is a flow chart illustrating an interrupt operation by MCU 18 shown in FIG. 2a which detects a vehicle speed.

When a pulsating potential ceases to appear on the signal line leading to the inverting input (−) of the comparator IC1 as a result of the breakage in the induction coil 14 or its connected lead wire, a short-circuit across lead wires or a short-circuit of the reference potential line SP (−) to the reference potential, the comparator IC1 continuously delivers an output of H level. Thereupon, pulse is no longer applied to MCU 18, which therefore does not proceed to the VSD interrupt operation shown in FIG. 2b. In the event the breakage or short-circuit as mentioned above occurs abruptly and continues to exist, the VSD interrupt operation cannot be performed, and hence the difference Vdec between values stored in the previous vehicle speed register $V_2$ and the vehicle speed register $V_1$ does not increase, whereby the inequality Vdc>Vk does not apply. In this instance, the breakage or short-circuit cannot be detected at the step A2. However, it will be seen that the probability that the breakage or short-circuit occurs abruptly and continues to exist indefinitely is very small normally, and it will be understood that the breakage or short-circuit initially occurs for a relatively short length of time, followed by a return to a normal state, which is subsequently repeated until a perpetual breakage or short-circuit is reached. In such instance, when the breakage or short-circuit for a relative short length of time and the return to a normal state repeat themselves, rectangular pulses are applied to MCU 18, which therefore execute the VSD interrupt operation, whereby the calculated speed will vary to a greater degree such that the inequality Vdc>Vk applies, whereupon "1" is written into the error register FAIL.

When a short-circuiting of the reference potential line SP (−) to the common potential occurs, the output from the comparator IC2 will be at its L level during the time the short-circuit is present whether such event occurs abruptly and subsequently continues to exist or the short-circuit for a relatively short length of time and the return to the normal state repeat themselves, whereby MCU 18 detects the L level output at step A4 (FIG. 1b), thus writing "1" into the error register FAIL.

In a routine, not shown, in which a new gear ratio to be established is determined, MCU 18 examines the content of the error register FAIL, and if it is "1", the new gear ratio to be established will be chosen as a fail-safe gear ratio, to which the automatic, variable speed transmission 21 is set up. In the event a backup vehicle speed signal generators 13 to 15 are provided, the operation will be switched to detecting the vehicle speed in accordance with such generators.

While a specific embodiment of the invention has been described above, it should be understood that a variety of changes and modifications are possible therein without departing from the scope and spirit of the invention as defined by the appended claims. By way of example, the diodes D1 and D4 in the bias circuit 15b may be replaced by Zender diodes. The short-circuit detector 15f may comprise a discrete transistor circuit.

What we claimed is:

1. A binary digitizer circuit for a voltage developed by an induction coil comprising:
   bias means for applying a potential which is above a ground potential to a reference potential line which is connected to one end of an induction coil;

a clamper, connected to the reference potential line and to a signal line which is connected to the other end of the induction coil, for limiting a signal potential which appears on the signal line to a range defined between a first level which is a given value below the potential of the reference potential line and second level which is a given value above the potential of the reference potential line;

pulse shaping comparison means, coupled to said clamper, for digitizing the signal potential, as limited by the clamper, into a binary signal in accordance with a reference potential which depends on the potential of the reference potential line; and abnormality detecting means, coupled to said reference potential line, for producing information indicative of an abnormality in response to a reduction of the potential of the reference potential line relative to the ground potential.

2. A binary digitizer circuit according to claim 1, wherein the pulse shaping comparison means comprises a first comparator of an open collector type formed by a semiconductor integrated circuit, said first comparator having its inverting and non-inverting inputs connected to an output of the clamper and the reference potential line, respectively, and wherein the abnormality detecting means comprises a second comparator of an open collector type formed by a semiconductor integrator circuit, said second comparator having its inverting and non-inverting inputs connected to an output of the bias means and the reference potential line, respectively, and said second comparator having its output coupled to an output of the first comparator.

3. A binary digitizer circuit according to claim 2, wherein the bias means comprises a resistor connected between a voltage source and the reference potential line, and a pair of diodes connected in series, said pair of diodes being connected between the reference potential line and a ground potential line, and each of the diodes being biased in the same direction, and wherein a non-inverting input of the second comparator is connected to an anode of one of the diodes and an inverting input of the second comparator is connected to a cathode of one of the diodes.

* * * * *